United States Patent [19]
Farnworth

[11] Patent Number: 5,079,618
[45] Date of Patent: Jan. 7, 1992

[54] SEMICONDUCTOR DEVICE STRUCTURES COOLED BY PELTIER JUNCTIONS AND ELECTRICAL INTERCONNECT ASSEMBLIES

[75] Inventor: Warren M. Farnworth, Nampa, Id.

[73] Assignee: Micron Technology, Inc., Boise, Id.

[21] Appl. No.: 741,222

[22] Filed: Jul. 2, 1991

Related U.S. Application Data

[63] Continuation of Ser. No. 536,734, Jun. 12, 1990, abandoned.

[51] Int. Cl.[5] .................. H01L 23/02; H02B 1/00; H05K 7/20
[52] U.S. Cl. ........................... 357/81; 357/87; 361/381; 361/388
[58] Field of Search ............ 357/82, 87; 361/379, 361/380, 381, 386, 388

[56] References Cited
U.S. PATENT DOCUMENTS 4,238,759 12/1980 Hunsperger .................. 357/87
4,685,081 8/1987 Richman ..................... 357/87

*Primary Examiner*—Andrew J. James
*Assistant Examiner*—Carl Whitehead, Jr.
*Attorney, Agent, or Firm*—William J. Bethurum

[57] ABSTRACT

A single series electrical circuit for cooling an electronic device while simultaneously providing series electrical current through the device to provide operational power. In this manner, increases or decreases in operating current through the device causes proportional increases or decreases in Peltier cooling current through one or more Peltier cooling junctions within the circuit to produce a desired increased or decreased cooling of the device with increases and decreases of heat dissipation from the device. The series electrical circuit and method of operation includes the provision of first and second power supply terminals and an electronic device connected to one of the power supply terminals. A Peltier cooling junction is connected to one side of the electronic device where a Peltier heating junction is connected to one side of the Peltier cooling junction. Then, a heat sink is connected between one side of the Peltier heating junction and the other power supply terminal for conducting heat away from the electronic device being cooled.

14 Claims, 5 Drawing Sheets

SEMICONDUCTOR DEVICE STRUCTURES COOLED BY PELTIER JUNCTIONS AND ELECTRICAL INTERCONNECT ASSEMBLIES

This application is a continuation of copending application Ser. No. 07/536,734 filed on June 12, 1990, now abandoned.

TECHNICAL FIELD

This invention relates generally to the electronic cooling of solid state devices and more particularly to the use of Peltier junctions to provide cooling and good heat dissipation for a wide range of semiconductor devices such as integrated circuits, transistors, Triacs, silicon controlled rectifiers (SCRs) and the like.

BACKGROUND ART

It is well known that the speed and power output capabilities of a variety of semiconductor devices are dependent upon the carrier mobility and transit time response of these devices. It is further well known that these latter characteristics are temperature dependent. Thus, when these devices are driven beyond their upper power limits or current ratings, they may heat up to in turn reduce the levels of carrier mobility and transit time therein and thereby cause a concurrent reduction in speed and power output of these devices, and in some cases device burn-out. Thus, when these devices are mounted on lead frames or headers and encapsulated in a package, good heat transfer and heat dissipation from these devices have always been primary considerations in package design.

In the past, the use of passive cooling methods having good heat transfer characteristics and thermal dissipation characteristics for lead frames, component headers and the like has frequently been adequate for providing satisfactory heat dissipation and heat transfer for electronic devices operating within certain prescribed and normal limits of power output and operational speed. However, with the recent rapid advances in the art of integrated circuit memories, for example, where several thousand transistors may be fabricated in a single semiconductor chip, there is a definite need to provide an active enhanced cooling capability for these devices in addition to the above types of passive cooling methods.

Thus, active cooling structures may be used to provide an additional kind and degree of cooling for these semiconductor devices. This enhanced cooling may be desirable, for example, to allow these semiconductor devices to operate at even greater speeds and higher powers (and higher speed-power-product figures of merit) than were heretofore possible. These devices not only include integrated circuits as indicated above having many thousands of transistors therein, but they may also include individual power transistors which, with the help of additional active cooling, would be capable of operating at significantly greater speeds and output powers than they are presently capable of operating using only passive cooling methods.

The specific type of cooling employed herein and the technical field of the present invention is that of Peltier cooling capable of using either metal-metal or metal-semiconductor Peltier junctions. These junctions produce either a cooling or heating effect at the metal-metal or metal-semiconductor interface, depending upon the direction of current flowing across this interface. More specifically, there is either an evolution or absorption of heat at the Peltier junction depending upon the direction of current flowing thereacross. This effect has been described in many prior art patents and publications and is based upon a discovery made by Jean Peltier in 1834.

Circuits using Peltier junctions have also been described in the prior art, and one such circuit is described for example in U.S. Pat. No. 4,685,081 issued to Jay L. Richman and incorporated herein by reference. The Richman circuit is used for the thermal control of a bubble memory device, and in significant contrast to the invention described below, the Richman circuit uses Peltier cooling junctions which are positioned outside the heat sink and semiconductor device package in which the cooled semiconductor device is mounted. This type of Peltier junction mounting arrangement is inefficient in its cooling because of its physical separation from the semiconductor device being cooled and further because it is not integrally formed with heat sink support members for the semiconductor device being cooled.

DISCLOSURE OF INVENTION

The general purpose and principal object of the present invention is to provide a new and improved packaging geometry and semiconductor device cooling arrangement wherein one or more active cooling devices are combined in a novel device interconnect structure and in such a manner as to optimize semiconductor device cooling and heat transfer in an electronic package. This package and associated interconnect structure is reliable and durable in operation and economical to manufacture.

To accomplish this object and purpose, there has been developed a novel semiconductor device interconnect arrangement which includes a header or lead frame member having a semiconductor device mounted thereon and further having electrical power leads connected to both the semiconductor device and to the header or lead frame for providing power to the semiconductor device. The lead frame or header includes one or more Peltier junctions mounted thereon and connected in series with the electrical power leads supplying power to the semiconductor device. These Peltier junctions are biased so that the current flowing through the electrical power leads and through the Peltier junctions provides a cooling effect and heat absorption at the Peltier junctions. These Peltier junctions operate to provide cooling by thermal conduction for the semiconductor device mounted adjacent thereto to thereby enhance the rate of heat dissipation from the semiconductor device. This in turn enables the semiconductor device to operate at higher speeds and higher power outputs than were heretofore possible.

In one embodiment of the invention, the semiconductor device to be cooled is mounted on a metal lead frame including first and second frame members between which is defined an air gap. The semiconductor device being cooled is positioned on top of both the first and second lead frame members and is disposed above a portion of the air gap therebetween. A corresponding first and second power input leads are spaced apart from the first and second lead frame members, respectively, and an N-type semiconductor Peltier material is positioned to connect one of the lead frame members with one of the power input leads and a P-type semiconductor Peltier material is positioned to connect the other of the lead frame members to the other of the power input leads. Electrical interconnects are also made between active terminals of the semiconductor device being cooled and both of the first and second lead frame members so as to connect the semiconductor device, the lead frame members, the P and N-type materials, and the power input leads all in series between the positive and negative terminals of a voltage supply.

The P and N-type materials define first and second Peltier junctions at the interface of these materials with the first and second lead frame members, so that these two Peltier junctions are connected directly in series with the semiconductor device between the voltage supply terminals. When current is passed through these two Peltier junctions in the process of supplying power to the semiconductor device, these junctions provide a cooling effect at the above interfaces and at the surface of the first and second lead frame members. This cooling is in turn transferred by thermal conduction through the first and second lead frame members and to the body of the semiconductor device to provide electronic cooling therefor. This action in turn provides improved heat dissipation for the heat generated within the semiconductor device during device operation, and in this manner the cooled semiconductor device is able to operate at a greater speed-power product figure of merit.

Another object of this invention is to provide a novel Peltier junction interconnect arrangement useful for cooling a wide range of semiconductor devices.

Another object of this invention is to provide an interconnect arrangement of the type described which may be integrated with relative ease into existing electronic device package and interconnect designs.

Another object of this invention is to provide an improved electronically cooled package and interconnect arrangement of the type described which is relatively economical to manufacture and is reliable in operation.

Another object of this invention is to provide a new and improved alternative planar process and planar device embodiment and geometry wherein Peltier cooling junctions are formed on the surface of a semiconductor substrate using well developed metal-silicon processing technology.

These and other objects and novel features of this invention will become more readily apparent from the following description of the accompanying drawings.

DETAILED DESCRIPTION OF THE PREFERRED EMBODIMENTS

Figure 1A:
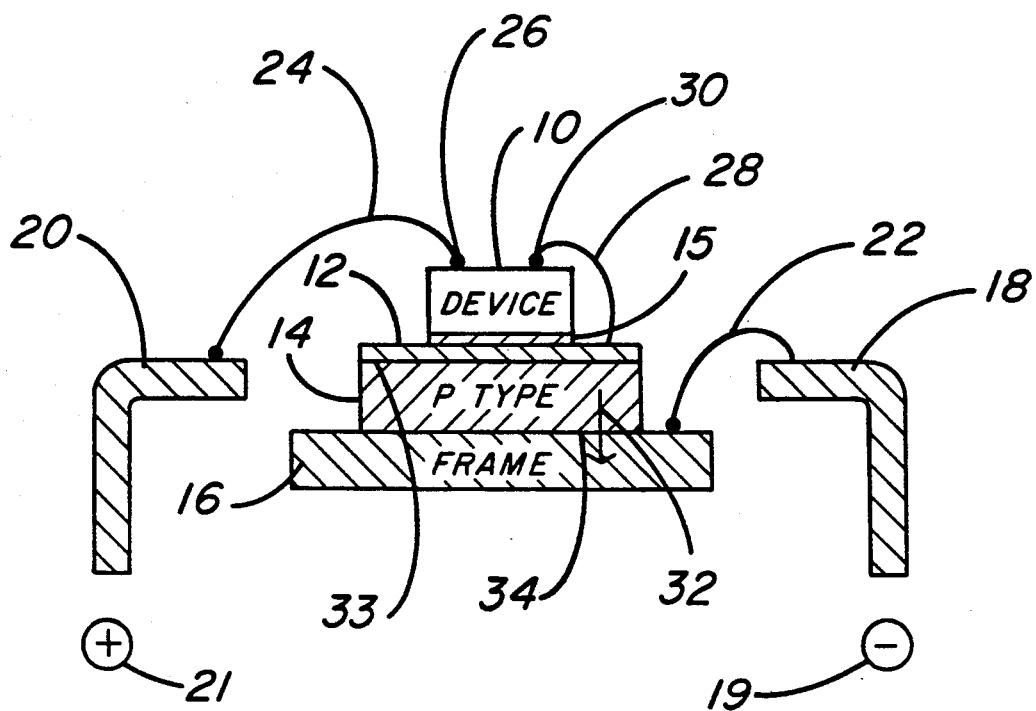
FIGS. 1A and 1B illustrate schematically two circuit diagrams in which a single stage of electronic cooling of a semiconductor device is provided using P and N-type Peltier cooling materials, respectively.

Referring now to FIG. 1A, there is illustrated a single stage of Peltier-type of electronic cooling for a semiconductor device 10 which is representative of a wide variety of semiconductor devices such as transistors, integrated circuits, Triacs, silicon controlled rectifiers, and the like. The semiconductor device 10 will typically be mounted as shown on the upper metal surface layer 12 of a P-type Peltier semiconductor substrate 14, which is preferably bismuth telluride, $Bi_3Te_2$. The metal surface layer 12 will typically be copper, and the metal layer 12 is electrically insulated from the semiconductor device 10 by an insulating adhesive layer 15 such as an epoxy resin or glue or a polyimide material sufficient to secure the semiconductor device 10 firmly in place on the surface of the metal layer 12. The P-type bismuth telluride slab 14 is in turn mounted on top of a metal lead frame or header member 16, typically made of copper.

The composite structure consisting of layers 10, 14, and 16 is mounted adjacent to a pair of electrical power leads 18 and 20 connected as shown to the negative and positive terminals 19 and 21 of a power supply, respectively. The negative power lead member 18 is connected by way of an interconnecting wire 22 to the metal frame member 16, and the positive electrical power lead member 20 is connected by way of an interconnect wire 24 to an operative terminal 26 for the semiconductor device 10. A third lead wire 28 is connected as shown between another terminal 30 of the semiconductor device 10 and the thin copper layer 12.

Bismuth telluride has been found to be an excellent and efficient cooling material useful in the formation of the Peltier junctions described herein and is available, for example, from the Materials Electrical Products Company (MELCOR) of Trenton, N.J. These P and N-type Peltier semiconductor materials and Peltier cooling and heating junctions formed thereby have been described in detail by MELCOR in their comprehensive technical publication and catalogue entitled *MELCOR Solid State Cooling With Thermoelectrics*, incorporated fully herein by reference. This publication includes a chart on page 15 thereof which gives the quality factor of bismuth telluride in terms of its ability to absorb and produce heat, and bismuth telluride has been found to be 1000 times more efficient in cooling as some other Peltier cooling materials. However, for considerations other than cooling efficiency alone, it may be desired to use other Peltier cooling materials, and a complete list of these other materials may be found in the *Encyclopaedia Brittanica* together with their associated quality factors. More specifically, these Peltier cooling materials, some of which may be used in place of the copper-bismuth materials disclosed herein, are listed in the *Encyclopaedia Brittanica*, 15th Edition, Benton and Company, Chicago, Copyright 1980 and the portion thereof subtitled *Brittanica Micropaedia*. Vol.

VIII, page 843, incorporating therein by reference the *Brittanica Macropaedia,* Volume 18, pages 315-321.

When current is passed from the positive lead 20 of a voltage supply and in the direction of the arrow 32 across a metal-P-type semiconductor junction 33 located between the P-type material 14 and the copper surface layer 12, there will be produced a Peltier heat absorption and a corresponding cooling effect at the junction 33. This cooling is in turn effective to provide good absorption of heat generated within and dissipated by the semiconductor device 10. This cooling will thereby provide an improved heat conduction path from the semiconductor device 10 and through the P-type Peltier semiconductor layer or slab 14 to the copper lead frame member 16. There will of course be a corresponding Peltier heating effect at the lower Peltier junction 34.

Figure 1B:
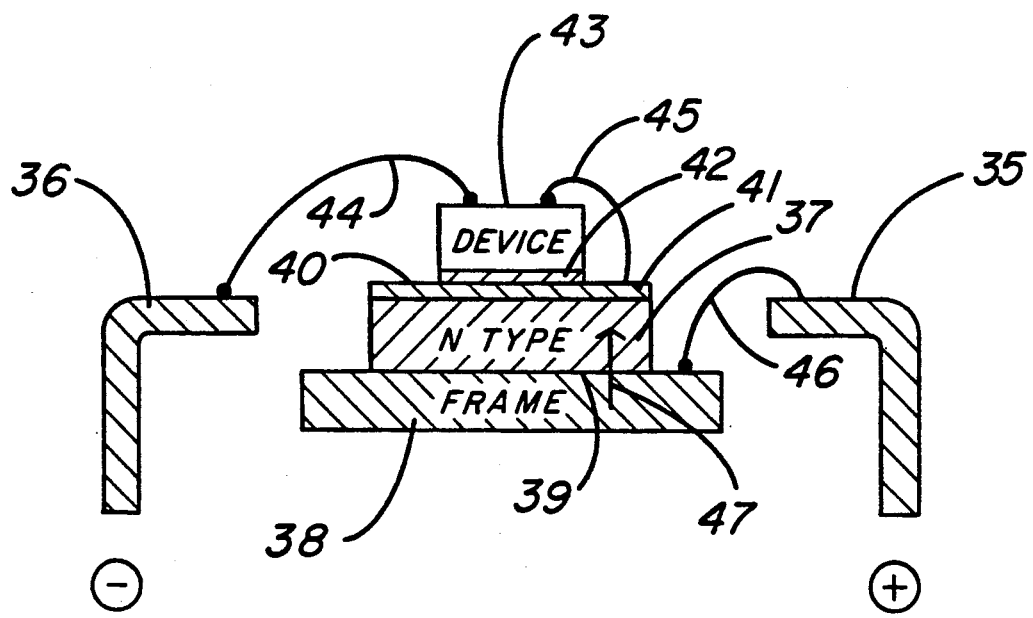

Referring now to FIG. 1B, if the bismuth telluride Peltier semiconductor material is now doped to be N-type rather then P-type, then the polarity for the lead frame members 35 and 36 must be reversed as indicated in this figure. The bismuth telluride layer 37 is mounted as shown on a copper frame 38 which defines a lower Peltier heating junction 39, and a surface layer 40 of copper defines an upper Peltier cooling junction 41 at its interface with the N-type slab 37. Again, a suitable insulating adhesive layer 42 such as an epoxy glue is utilized to secure the semiconductor device 43 firmly in place as shown on the top of the copper layer 40. A pair of wire bonded leads 44 and 45 are used to connect the device 43 electrically in series with the above Peltier junctions 39 and 41, and another single lead 46 connects the metal frame member 38 to the positive lead terminal 35.

In this embodiment of the present invention, the current will pass upwardly in the direction of the arrow 47 and across the lower Peltier heating junction 39 between the metal lead frame 38 and the N-type Peltier semiconductor material 37 and then across the Peltier cooling junction 41. Thus, the cooling effect and heat absorption produced by this current flowing across the upper Peltier cooling junction 41 in FIG. 1B will provide enhanced heat conduction away from the device 43, and the dissipation of heat generated by the semiconductor device 43 will be thermally conducted through the N-type Peltier material 37 to the metal lead frame 38.

Figure 2A:
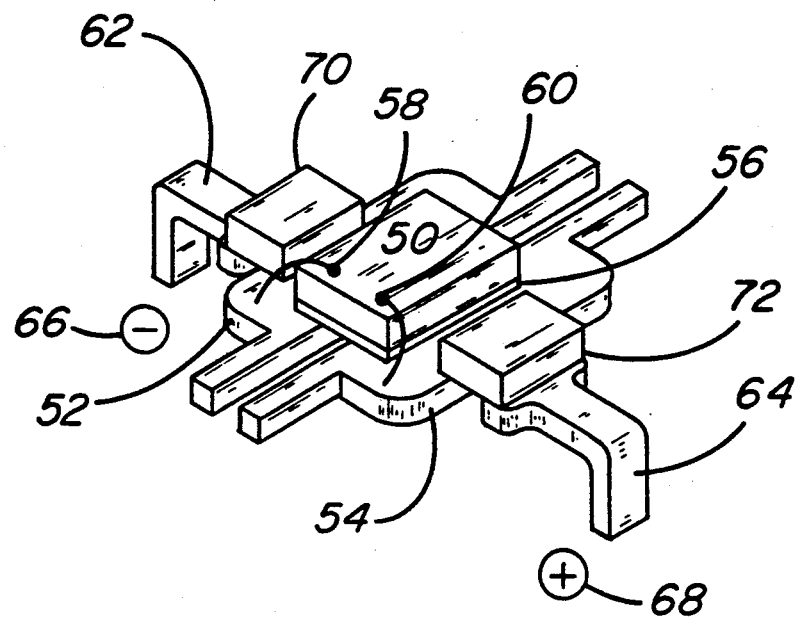
FIG. 2A is an isometric view illustrating dual stage Peltier cooling of a header or lead frame supporting a semiconductor device, such as an integrated circuit flat package.

Referring now to FIG. 2A, there is shown a semiconductor device flat package member 50 which is positioned as shown atop a pair of copper lead frame members 52 and 54. The device package 50 is supported on these lead frame members 52 and 54 by way of an electrically insulating layer 56 such as a suitable epoxy resin, and the semiconductor device package 50 will typically be electrically powered by way of a pair of wire bonded interconnect members 58 and 60. These interconnect wires 58 and 60 are connected as shown, respectively, to the upper surfaces of the copper lead frame members 52 and 54.

Figure 2B:
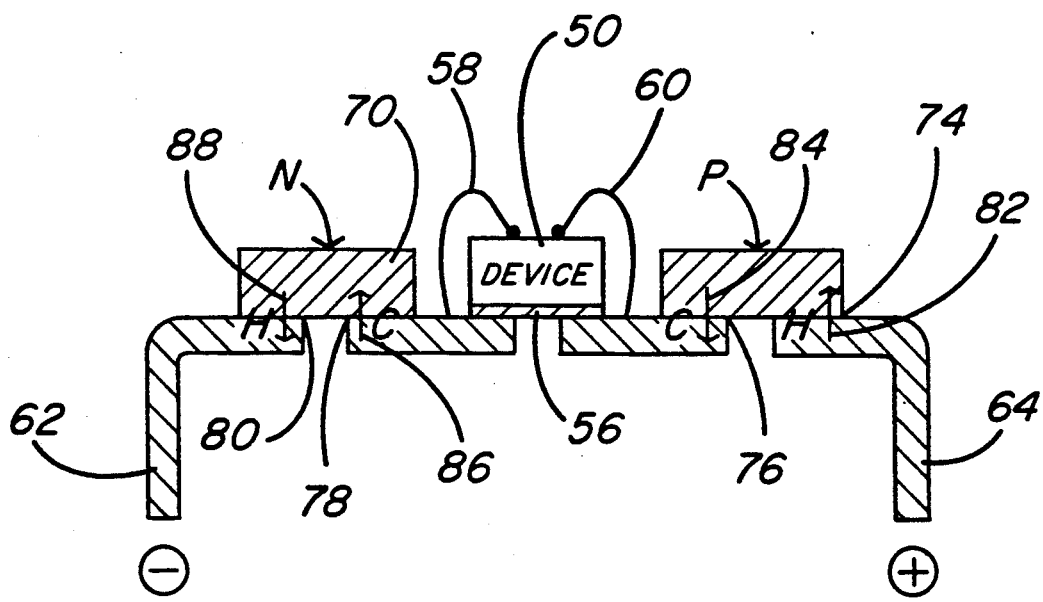
FIG. 2B is a cross-sectional view taken along lines B—B of FIG. 2A.

The electrical interconnect assembly arrangement shown in FIGS. 2A and 2B further includes first and second copper power leads 62 and 64 connected as shown, respectively, to the negative and positive terminals 66 and 68 of a power supply. The upper surfaces of the first and second electrical power leads 62 and 64 are generally co-planar with the upper surfaces of the first and second copper lead frame members 52 and 54 in order to receive and support as shown an N-type Peltier semiconductor element 70 and a P-type Peltier semiconductor element 72, respectively.

Referring now to FIG. 2B, when the semiconductor device package 50 is energized to cause the current to flow across the metal-semiconductor junctions shown therein, there will be a heating and cooling effect at the respective metal-semiconductor junctions 74, 76, 78, and 80 as indicated by the (H) legend meaning hot and the (C) legend meaning cold. Thus, the current flowing in the path of the arrow 82 across the metal-semiconductor junction 74 will produce a heating effect, whereas the current flowing serially through the semiconductor-metal junction 76 in the direction of the arrow 84 will provide heat absorption and a cooling effect at the junction 76 and located closely adjacent to the semiconductor device 50 as desired.

With the conductivity type of the Peltier material changed to N-type semiconductor for the Peltier element 70, the current flowing in the direction of the arrow 86 across the metal-semiconductor junction 78 will produce a cooling effect across this junction and the current continuing to flow in the direction of the arrow 88 across the semiconductor-metal junction 80 and to the negative voltage supply terminal will produce a heating effect at the semiconductor-metal junction 80. Thus, this novel arrangement and electrical interconnect and biasing method ensures that Peltier cooling (C) is provided closely adjacent to the semiconductor device 50 on the first and second metal copper frame members 52 and 54, and that the associated heating (H) which is necessarily a part of this type of biasing arrangement occurs at a place remote from the semiconductor device 50 and at the first and second power input leads 62 and 64. Here the heat can be conducted away from the semiconductor device package 50 and dissipated using known and available state-of-the-art heat sinking and conduction methods.

Figure 3:
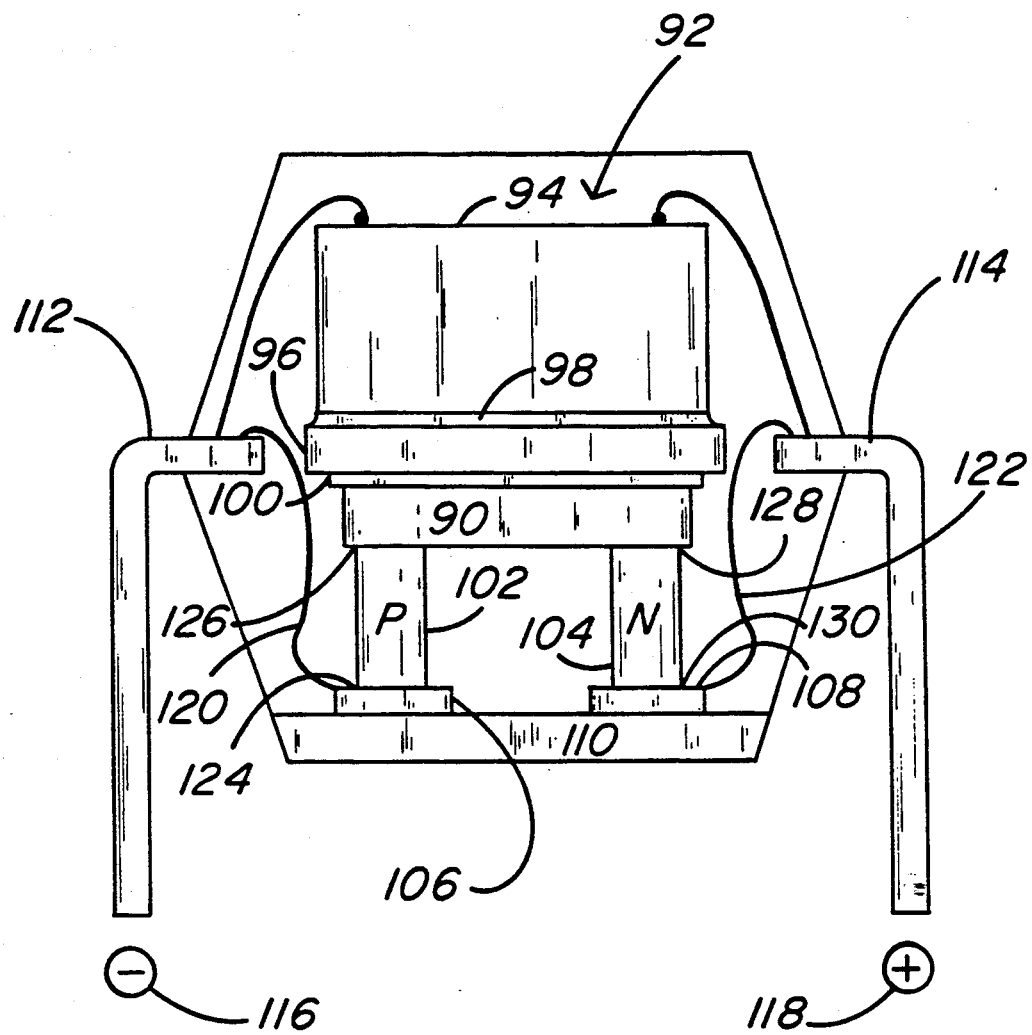
FIG. 3 is an isometric view of dual stage cooling and its associated electrical interconnect assembly for a TO-type of transistor package.

Referring now to FIG. 3, there is shown another and different type of dual stage cooling arrangement wherein cooling by the Peltier effect is provided to a single copper lead frame member 90 as distinguished from the two separate lead frame members 52 and 54 as shown in FIGS. 2A and 2B above. The single unitary copper lead frame member or substrate 90 will typically provide support for a transistor or integrated circuit (IC), and the semiconductor die to be cooled is packaged as indicated by 92 in a conventional manner. The IC or transistor 94 will typically be bonded to an intermediate heat sink member 96 by way of an epoxy adhesive layer 98. The lead heat sink member 96 is in turn bonded on its underside to the copper header or substrate member 90 by way of another insulating adhesive layer 100.

The metal header member 90 is mounted as shown on its left side undersurface to a P-type Peltier semiconductor post 102 and its the right side undersurface to an N-type Peltier semiconductor post 104. The two P and N-type semiconductor posts 102 and 104 are in turn mounted on a pair of copper support pads 106 and 108 which themselves are affixed to underlying support member 110 for the package 92. A pair of power input leads 112 and 114 are connected, respectively, as shown to the negative and positive voltage supply terminals 116 and 118, and a corresponding pair of interconnect wires 120 and 122 provide the necessary electrical interconnection between the facing ends of the power leads 112 and 114 and the copper pads 106 and 108, respectively. A separate pair of wires 121 and 123 interconnect the two power leads 112 and 114 to a pair of terminals 125 and 127 on the semiconductor device 92.

In operation, current flowing from the positive voltage supply terminal 118, through the power lead 114 and the interconnect wire 122 and then up through the metal-semiconductor junction 130 will provide a heating effect at this junction 130. As this current continues to flow across the semiconductor-metal junction 128 at the top of the N-type semiconductor post 104, this current produces a cooling effect and heat absorption at this junction 128 which is transmitted via thermal conduction to the copper substrate or slab 90. As this current continues to flow through the slab 90 from right to left in FIG. 3 and then down through the metal-semiconductor junction 12 at the top of the P-type semiconductor post 102, there will be produced a heat absorption and cooling effect at this junction 126. As the current continues to flow vertically down through the P-type semiconductor post 102 and across the semiconductor-metal junction 124 at the bottom of the post 102, there will be produced a heating effect and heat evolution at the semiconductor metal junction 124. Thus, the horizontal copper slab or substrate 90 is provided with a separate cooling junction 126 and 128 on each side thereof. This cooling effect and heat absorption imparts excellent heat dissipation and thermal transfer within the copper substrate 90 for the heat generated within the transistor package 92 and passing across the insulating layers 98 and 100 on each side of the intermediate heat sink member 96.

It will be understood and appreciated by those skilled in the art that the embodiment of FIG. 3 described above may be modified to include a large plurality of P-N-P-N-etc. side-by-side posts and associated Peltier junctions located between the device lead frame and heat sink. One suitable arrangement for this purpose is described on page 2 of the above identified MELCOR publication. Cooling assemblies such as the one shown in FIG. 3 above, or modified as suggested with an increased number of Peltier cooling junctions, may be used to pull as much as 60–70 thermal watts from the device package being cooled. As an example only, this means that if a semiconductor device conducting 10 amps would reach its $I^2R$ maximum heat point without Peltier cooling, the same device may be increased to conduct 14 amps when used with 60–70 watts of Peltier cooling. The value of resistance R for a typical semiconductor device will typically be about 2 ohms for both of the above conditions.

Figure 4A:
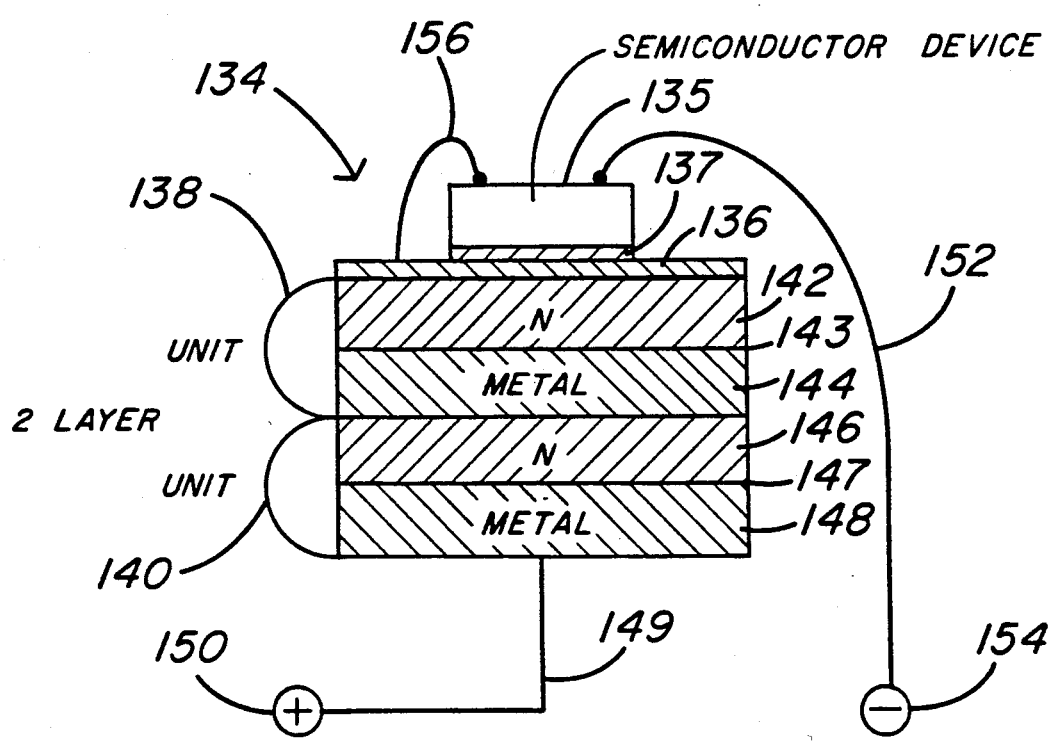
FIG. 4A is a schematic and abbreviated cross-section illustration of a series connected dual stage cooling arrangement for cooling a single semiconductor device, such as a transistor.

Referring now to FIG. 4A, there is shown a dual stage cooling arrangement 134 useful for cooling a semiconductor device 135 such as a power transistor. The semiconductor device 135 is secured to a thin upper metal layer 136, preferably copper, by an insulating adhesive material 137, such as an epoxy resin or glue. These components 135, 136 and 137 are cooled in the manner described below by the two Peltier cooling units 138 and 140. The cooling arrangement in FIG. 4A may be constructed using a pair of metal-semiconductor cooling units 138 and 140 manufactured by the Materials Electrical Products Company (MELCOR) of Trenton, N.J. The units 138 and 140 will each include a metal layer and a semiconductor layer as indicated. The upper unit 138 is comprised of an N-type bismuth telluride layer 142 disposed on a copper substrate 144, and the lower unit 140 is comprised of an N-type bismuth telluride layer 146 disposed on a copper substrate 148. The copper substrate 148 is connected by way of a lead wire 149 to a positive voltage supply terminal 150 and the semiconductor device 135 is connected by way of lead wire 152 to a negative voltage supply terminal 154. A device power lead 156 is connected as shown between the upper surface of the copper layer 136 and an active terminal 156 of the semiconductor device 135.

When the device assembly 134 is connected and biased with the polarity shown in FIG. 4A, the current flowing upwardly from the copper substrate 148 and through the metal semiconductor Peltier junctions 147 and 143 between the metal semiconductor layers 148 and 146 and layers 144 and 142 will produce a series cooling effect at these two Peltier junctions. The corresponding heat absorption at these two junctions 143 and 147 will provide heat sinking for and good thermal dissipation and heat conduction away from the power device 135. Thus, FIG. 4A serves to illustrate an interconnect method in accordance with the present invention which may be made using a series of stacked metal and semiconductor layers adjoined directly to a major supporting substrate for a power transistor or the like.

Figure 4B:
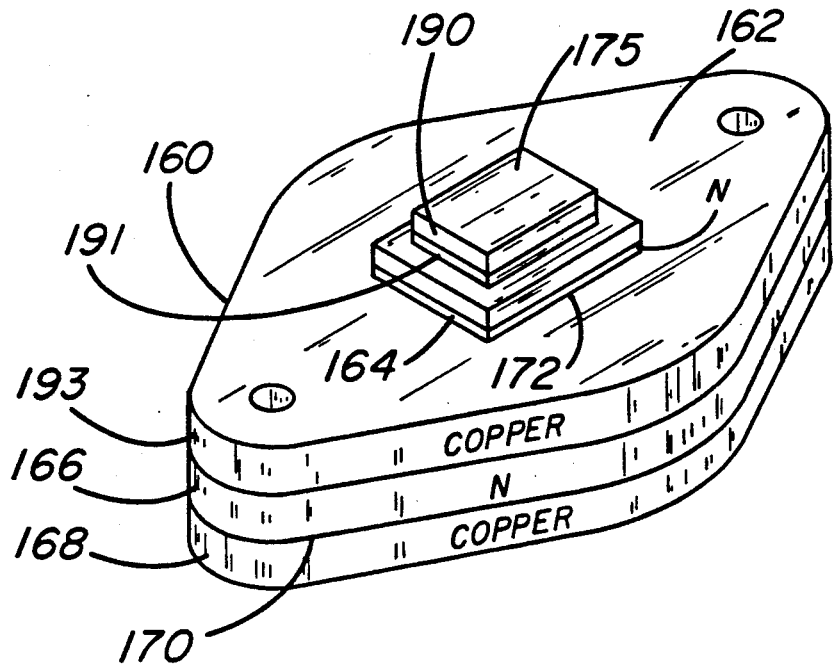
FIG. 4B is an isometric view showing a modification of FIG. 4A wherein an N-type substrate is mounted on the upper surface of a generally elliptical and well-known geometry for use with a metal-semiconductor-metal header structure.

Referring now to FIG. 4B, this figure merely shows a modification of the generic structure in FIG. 4A wherein the metal, semiconductor and metal supporting layers are configured in a generally elliptical and well recognized geometrical contour 160. These layers include an upper copper substrate layer 162 arranged to support an N-type semiconductor $Bi_3Te_2$ die 164. The arrangement in FIG. 4B further includes an intermediate N-type semiconductor layer 166, such as bismuth telluride, and a lower copper substrate 168 also configured in the generally elliptical contour as shown.

The lower metal-semiconductor Peltier junction 170 between the layers 166 and 168, the metal-semiconductor Peltier junction 172 beneath the N-type semiconductor 164 as well as the copper substrate 190 and Peltier junction 191 will operate in series to provide dual stage Peltier cooling as did the Peltier junctions previously described in FIG. 4A. This cooling effect is a result of the heat absorption at these junctions 191 and 193 when a current is passed vertically upward through the structure of FIG. 4B.

In this figure, the package 175 will include the semiconductor device, adhesive, and upper copper layer equivalents or the two components 135 and 137 in FIG. 4A. It should be understood that the cooling and heat sink design shown in FIG. 4B may be modified so that the elliptically shaped layers 162 and 166 have the same rectangular configuration as the copper substrate 190 and N-type layer 164 and device package 175, respectively, leaving only the lowermost layer 168 of a larger elliptically shaped heat sinking copper substrate. Such a modified arrangement would provide quite acceptable cooling in the proposed equal area metal-N-metal-N-metal rectangular layers forming a "post" on the lower larger copper substrate 168. That is the area of the Peltier junctions need not necessarily be larger in area than that of the semiconductor device being cooled.

Figure 5:
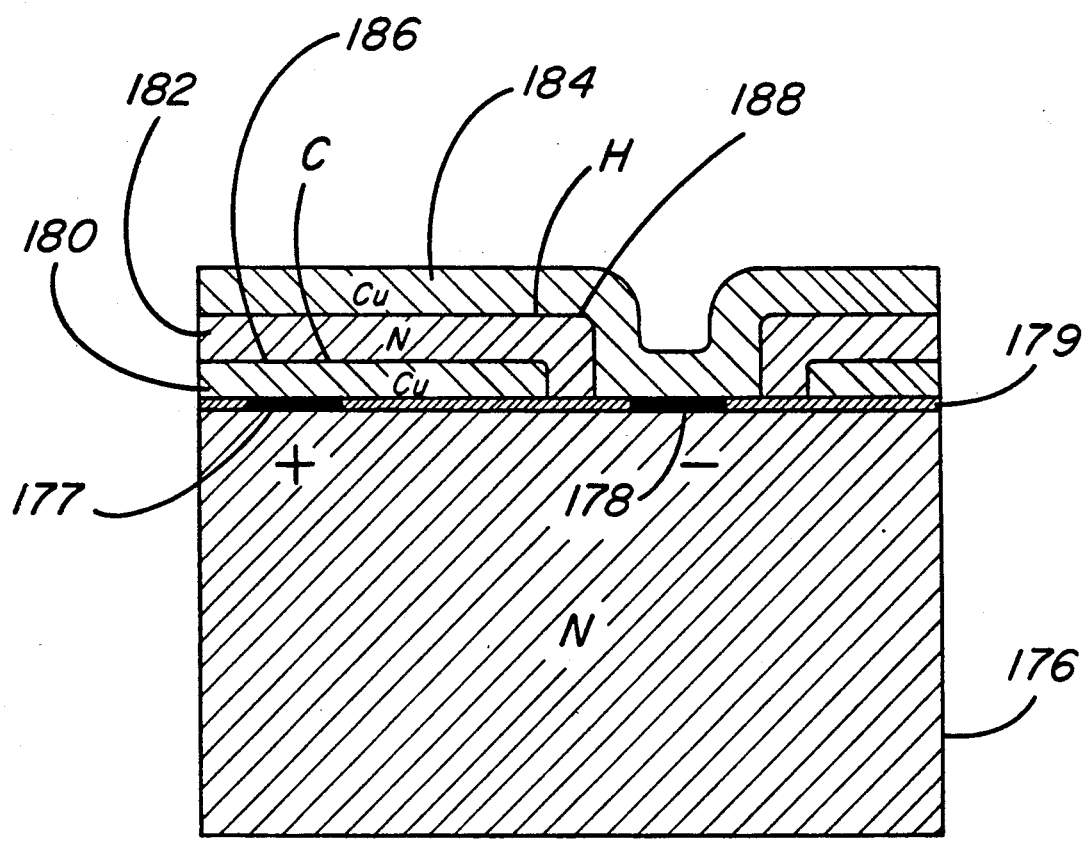
FIG. 5 is an abbreviated or schematic cross-section view of yet another modified form of Peltier cooling wherein the N-metal-N-metal cooling junctions are formed in a planar fashion on the surface of a semiconductor die using, for example, chemical vapor deposition (CVD) processes.

Referring now to FIG. 5, there is shown both a novel process modification and a novel semiconductor device geometry arrangement and configuration in accordance with another embodiment of the present invention. In FIG. 5, there is shown an N-type semiconductor substrate or die 176 containing one or more semiconductor devices (not shown) which generate heat and need to be cooled. The N-type substrate 176 may, for example, be an integrated circuit containing thousands of individual transistors, so that for reasons based upon many diverse process and device considerations, it may be preferable to use monolithic planar processing and state-of-the-art photolithography to form the Peltier cooling junctions for this structure. This is made possible in accordance with the embodiment in FIG. 5 by first defining the location of positive and negative power supply leads or surface conductors 177 and 178 on the surface of the substrate 176. These conductors 177 and 178 are normally located in surface openings or vias which are photolithographically defined in a surface passivation layer 179. This insulating layer 179 may be formed of materials such as silicon dioxide, silicon nitride, or silicon-oxynitride. These surface passivation and insulating layers are either grown or deposited on the surface of the N-type semiconductor substrate 176 using well known planar processing techniques.

Then, using chemical vapor deposition (CVD) and planar processing layer-defining methods, a series of copper-N-type-copper layers 180, 182, and 184 may be deposited in a planar fashion to thereby form a Peltier cooling junction 186 and a Peltier heating junction 188. These junctions 186 and 188 are thus connected in a series circuit between the positive lead 177 and the negative lead 178, and this is done in an elegantly simple process whereby the N-type intermediate layer of $Bi_3Te_2$ is formed to electrically insulate the adjacent metal layers 180 and 184.

Thus, it may be possible to use some of the same photolithographic masking, etching, and CVD processing equipment that is used in integrated circuit manufacture for the purpose of defining the planar structure shown in FIG. 5. This feature, in turn, may not only serve to decrease production costs, but it may also be very beneficial to enhancing device reliability and production yields. This is true because of the well developed and advanced nature of available state-of-the-art planar processing techniques which have been undergoing continuous improvements for the past thirty years.

The process and device described above with respect to FIG. 5 are not limited to the metal-semiconductor-metal layered arrangement presented, but may instead be incorporated into multi-level metallization (MLM) processes wherein the Peltier heating and cooling junctions may be themselves located within larger MLM structures and configured to take advantage of the existence of other metals, such as aluminum and gold, as the Peltier junction forming materials.

Various other modifications may be made in the above described embodiments without departing from the spirit and scope of this invention. For example, the invention is not limited to the use of either bismuth telluride as a semiconductor material or to the specifically formed metal-semiconductor Peltier junctions described above. If desired, the Peltier effect as described above may be obtained by the use of metal-metal junctions formed, for example, by the adjoining of metals such as bismuth and antimony together to form a metal-metal junction capable of either an evolution of heat or an absorption of heat at the junction. When using a bismuth-antimony junction, for example, heat will be produced at the junction if current flows from the bismuth to the antimony, whereas heat will be absorbed at the junction if current flows in the opposite direction from the antimony to the bismuth. This evolution or absorption of heat arises because the two metals are at different potentials and thereby require work or heat to carry electrons from one metal to the other. Accordingly, many of these other types of suitable Peltier junctions may be those identified in the above *Encyclopaedia Brittanica* reference.

Additionally, many modifications may be made in the above described semiconductor device package designs and circuit connections therefor, and also in the above planar processing techniques and device geometry. The specific electrical interconnects shown for these designs may also be modified by those skilled in the art. For example, one such design modification would be to bond the Peltier unit wire 122 in FIG. 3 to the surface of the device 94 and also connect the wire 122 in series with a current control element (not shown) which could be designed directly into the circuitry of the device 94. The proposed current control element could be made operative to sense and control current during Peltier cooling and thereby reduce Peltier unit power consumption when additional cooling is not required.

This same type of series current control connection can be made to the power sources for the other described embodiments, but connected therein in parallel to the device being cooled. Active circuitry for such current control devices could also be implemented by those skilled in the art. The series current control element for both of the above proposed power control applications could be as simple as a thermistor or as complex as a sampling and amplifying network.

Accordingly, it is to be understood that these and other design modifications are clearly within the scope of the following appended claims.

What is claimed is:

1. An electrical interconnect and packaging assembly useful for cooling a wide variety of semiconductor devices including, in combination:
   a. a metal support member,
   b. a P-type or N-type semiconductor layer disposed on said metal support member and forming therewith a Peltier heating junction,
   c. a metal layer disposed on said semiconductor layer and forming therewith a Peltier cooling junction,
   d. an electronic device or device package disposed on said metal layer, and
   e. means for passing current through said cooling and heating Peltier junctions in a direction to provide heat absorption at said Peltier cooling junction.

2. The assembly defined in claim 1 wherein said means for passing current through said Peltier junctions further includes means for serially passing current to said electronic device and to said Peltier junctions from a single power supply, whereby said metal support member is multi-functional in that it provides mechanical support, electrical bias and electronic cooling and heat sinking for said electronic device.

3. An electrical interconnect and package assembly including, in combination:
   a. a semiconductor device,
   b. first and second metal frame members supporting said semiconductor device,
   c. first and second power leads positioned adjacent said first and second metal frame members, respectively, for providing power to said semiconductor device, and
   d. first and second Peltier semiconductor materials connected, respectively, between said first power lead and said first metal frame member and said second power lead and said second metal frame member for providing Peltier cooling junctions at the surfaces of said first and second metal frame members for cooling said semiconductor device mounted thereon.

4. The assembly defined in claim 3 wherein said first and second metal frame members and said first and second power leads are substantially co-planar for receiving said first and second Peltier semiconductor materials in a common support plane thereon and providing a compact packaging assembly for said semiconductor device.

5. An electrical interconnect and packaging assembly including, in combination:
   a. a semiconductor device,
   b. a metal substrate supporting said semiconductor device,
   c. a P-type Peltier semiconductor material extending from one location on an undersurface of said metal substrate,
   d. an N-type Peltier semiconductor material extending from another location on said underneath of said metal substrate, whereby said N-type and P-type semiconductor materials form first and second Peltier junctions at locations on the undersurface of said metal substrate, and
   e. means for passing current through said first and second Peltier junctions to provide heat absorption and a cooling effect thereat on the underside of said metal substrate.

6. The assembly defined in claim 5 wherein said current passing means includes first and second power leads mounted adjacent to said semiconductor device, and means connected between said power leads and said Peltier semiconductor materials for providing operating current to said Peltier semiconductor materials.

7. The assembly defined in claim 6 wherein said means for passing current through said Peltier junctions includes first and second wires extending from said first and second power leads, respectively, into electrical connection with said first and second Peltier junctions, whereby separate leads may be extended from said first and second power leads to both said Peltier junctions and to said semiconductor device to independently provide electrical bias and power thereto in the operation of said assembly.

8. An electronic cooling arrangement for a semiconductor substrate which includes positive and negative voltage supply conductors disposed on said substrate, and series-connected semiconductor and metal layers disposed in a layered configuration on or adjacent to a surface of said substrate to form one or more Peltier junctions connected between said positive and negative voltage supply conductors.

9. The arrangement defined in claim 8 wherein metal layer is copper and said semiconductor layer is bismuth telluride.

10. The arrangement defined in claim 8 wherein series connected layers of copper, bismuth telluride and copper are disposed atop said surface of said substrate between said positive and negative voltage supply conductors and define Peltier junctions which terminate in a planar fashion at a surface passivation layer on said substrate.

11. An electrical interconnect and packaging assembly useful for cooling a wide variety of electronic devices including, in combination:
   a. a metal support member such as a transistor header or an integrated circuit lead frame,
   b. a P-type or N-type Peltier semiconductor layer mounted on said metal support member and forming a Peltier heating junction at the interface of said semiconductor layer and said metal support member,
   c. a thin metal layer disposed on the surface of said P-type or N-type Peltier semiconductor layer and forming thereat a Peltier cooling junction therewith,
   d. an electronic device disposed on the surface of said metal layer, and
   e. means for passing current through said Peltier cooling and heating junctions to provide Peltier cooling and heat absorption at the interface of said semiconductor layer and said thin metal layer and closely adjacent to said electronic device.

12. The assembly defined in claim 11 wherein means for passing current includes first and second power leads located adjacent to said metal support member and connectable to positive and negative power supply terminals, whereby electrical conductors may be connected between said power leads and said electronic device and said metal support member, respectively, and between said electronic device and said thin metal layer to thereby complete a series electrical circuit through said Peltier cooling and heating junctions while simultaneously providing a DC operating bias for said electronic package.

13. A single series electrical circuit for cooling an electronic device while simultaneously providing series electrical current through said device to provide operating power thereto, said series electrical circuit including, in combination:
   a. a first power supply terminal,
   b. an electronic device connected to said power supply terminal,
   c. a Peltier cooling junction connected to one side of said electronic device,
   d. a Peltier heating junction connected to one side of said Peltier cooling junction,
   e. a heat sink connected to said Peltier heating junction, and
   f. a second power supply terminal connected to said heat sink, whereby increases or decreases in operating current through said electronic device causes proportional increases or decreases in Peltier current through said Peltier junctions and thus provides proportional increased or decreased cooling of said electronic device with variations in operating power and corresponding heat dissipation of said electronic device.

14. A system for cooling an electronic device which includes, in combination:
   a. means for passing current in series between two power supply terminals, and
   b. means serially connecting said device, a Peltier cooling junction, a Peltier heating junction and a heat sink in series between said two power supply terminals so that said series current passes through said electronic device, said Peltier cooling and heating junctions and said heat sink and thereby provides Peltier cooling of said electronic device which is proportional to the current and heat dissipation demands of said electronic device.

* * * * *